(12) United States Patent
Luo et al.

(10) Patent No.: US 10,547,488 B2
(45) Date of Patent: *Jan. 28, 2020

(54) POLAR TRANSMITTER WITH TUNABLE MATCHING NETWORK

(71) Applicant: Huawei Technologies Co., Ltd., Shenzhen (CN)

(72) Inventors: Xun Luo, Chengdu (CN); Jian Liang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/295,630

(22) Filed: Mar. 7, 2019

(65) Prior Publication Data
US 2019/0207799 A1 Jul. 4, 2019

Related U.S. Application Data

(63) Continuation of application No. 15/816,073, filed on Nov. 17, 2017, now Pat. No. 10,257,015, which is a (Continued)

(30) Foreign Application Priority Data

Dec. 15, 2015 (EP) ...................................... 5200144

(51) Int. Cl.
H04L 27/36 (2006.01)
H04B 1/04 (2006.01)

(52) U.S. Cl.
CPC ............. H04L 27/361 (2013.01); H04B 1/04 (2013.01); H04L 27/368 (2013.01)

(58) Field of Classification Search
CPC ... H03L 2207/50; H03L 7/091; H03L 7/0991; H03L 7/1974; H03L 7/1806;
(Continued)

(56) References Cited

U.S. PATENT DOCUMENTS 6,487,398 B1 * 11/2002 Nobbe ................. H04B 1/0475
375/295
2005/0271161 A1 12/2005 Staszewski et al.
(Continued)

OTHER PUBLICATIONS

Akhtar, S., et al., "Quad Band Digitally Controlled Oscillator for WCDMA Transmitter in 90nm CMOS," IEEE 2006 Custom Intergrated Circuits Conference (CICC), Feb. 26, 2007, 4 pages.
(Continued)

Primary Examiner — Ajibola A Akinyemi
(74) Attorney, Agent, or Firm — Conley Rose, P.C.

(57) ABSTRACT

A polar transmitter includes an amplitude path comprising an amplitude signal that corresponds to an amplitude of a vector sum of an in-phase input signal and a quadrature input signal; a phase path comprising a phase modulator configured to phase-modulate a phase signal that corresponds to the phase of the vector sum of the in-phase input signal and the quadrature input signal; a digital power amplifier (DPA) configured to amplify the phase-modulated (PM) input signal based on the amplitude signal; a tunable matching network coupled to an output of the DPA and configured to adjust a load impedance of the DPA; and a controller configured to adjust the matching network based on a look-up table with respect to amplitude and frequency information, where the look-up table indicates a plurality of optimal operation modes of the matching network for specific combinations of amplitude and frequency information.

19 Claims, 8 Drawing Sheets

Related U.S. Application Data continuation of application No. PCT/CN2016/110124, filed on Dec. 15, 2016.

(58) Field of Classification Search
CPC ..... H03L 7/0992; H03L 7/1976; H03L 7/085; H03L 1/022; H03L 7/093; H03L 7/08; H04B 1/04; H04B 1/0475; H04B 17/13; H04B 2001/0425; H04B 1/0483; H04B 1/44
USPC ........................................................ 455/108
See application file for complete search history.

(56) References Cited

U.S. PATENT DOCUMENTS

| | | | |
|---|---|---|---|
| 2006/0038710 A1 | 2/2006 | Staszewski et al. | |
| 2006/0145758 A1 | 7/2006 | Klomsdorf et al. | |
| 2006/0291589 A1* | 12/2006 | Eliezer | H03C 3/40 375/302 |
| 2007/0194958 A1 | 8/2007 | Kirichenko et al. | |
| 2008/0002788 A1 | 1/2008 | Akhtar et al. | |
| 2008/0129610 A1 | 6/2008 | Tsfati et al. | |
| 2010/0026389 A1 | 2/2010 | Breslin | |
| 2010/0073103 A1 | 3/2010 | Spears et al. | |
| 2011/0070848 A1 | 3/2011 | Ramachandra | |
| 2014/0073271 A1* | 3/2014 | Ilkov | H03F 3/187 455/91 |
| 2014/0177755 A1* | 6/2014 | Lu | H03F 1/3241 375/297 |
| 2014/0355717 A1* | 12/2014 | Lu | H03F 1/0211 375/300 |
| 2015/0091657 A1* | 4/2015 | Gaynor | H03F 3/21 330/302 |

OTHER PUBLICATIONS

Foreign Communication From a Counterpart Application, European Application No. 15200144.2, Extended European Search Report dated Mar. 22, 2016, 9 pages.

Foreign Communication From a Counterpart Application, PCT Application No. PCT/CN2016/110124, English Translation of International Search Report dated Feb. 24, 2017, 7 pages.

Foreign Communication From a Counterpart Application, PCT Application No. PCT/CN2016/110124, English Translation of Written Opinion dated Feb. 24, 2017, 4 pages.

* cited by examiner

POLAR TRANSMITTER WITH TUNABLE MATCHING NETWORK

CROSS-REFERENCE TO RELATED APPLICATIONS

This application is a continuation of U.S. application Ser. No. 15/816,073, filed on Nov. 17, 2017, which is a continuation of International Patent Application No. PCT/CN2016/110124, filed on Dec. 15, 2016, which claims priority to European Patent Application No. EP15200144.2, filed on Dec. 15, 2015. The disclosures of the aforementioned applications are hereby incorporated by reference in their entireties.

BACKGROUND

The wideband power amplifier (PA) is the key component in the wideband transmitter (TX). Currently a lot of wideband PA design solutions are used such as distributed amplifier, balanced amplifier, high-order output matching amplifier and tunable amplifier. Multiple inductors for the inter-stage/output-stage matching and tunable matching network with low quality-factor are in sacrifice of power efficiency for such PAs, respectively.

Back-off efficiency of available PA designs is poor even when using an output matching network such as a dual-modes matching network or even a multiple modes matching network. There is a need to provide a design concept for a wideband power amplifier or TX with high back-off efficiency.

SUMMARY

It is the object of the disclosure to provide a method for a wideband power amplifier or TX with improved saturated and back-off power efficiency with compact size which can be applied in multiple communication standards.

This object is achieved by the features of the independent claims. Further implementation forms are apparent from the dependent claims, the description and the figures.

The basic concept described in this disclosure is related to a novel feed-forward architecture for digital polar TX with multi-mode dynamic-matching (DM) network in order to enhance the saturated and back-off efficiency in wideband. The operation modes are trained to obtain the optimized matching modes under various amplitude control words (ACWs) and radio frequency (RF) frequency. Compared to the TX with a fixed matching network, the bandwidth of the TX with DM network is extended compared to the TX without DM network, and the power efficiencies at saturated and back-off power levels are also improved.

In order to describe the disclosure in detail, the following terms, abbreviations and notations will be used.
PA: power amplifier
DPA: digital power amplifier
RF: radio frequency
TX: transmitter
DM: dynamic matching
A: amplitude
ACW: amplitude control word
LO: local oscillator
IF: intermediate frequency
DCO: digital controlled oscillator
PM: phase modulation or modulated
The RF signal is the RF of the phase modulator output in polar transmitter, which is the same as the RF after up-conversion of IF signal or baseband signal in a conventional analog transmitter. I and Q are in-phase and quadrature-phase signals.

LO frequency is the center frequency of RF signal. Channel frequency is determined by the sub-carriers (the center frequency of the sub-channel) in communication standards. For example there are 52 sub-channels for Institute of Electrical and Electronics Engineers (IEEE) 802.11g. LO tracking the channel frequency.

LO is tracking the desired channel frequency. LO is realized by voltage controlled oscillator (VCO) or DCO.

ACW means digital code of A; ACW is more specific for the implementation example.

According to a first aspect, the disclosure relates to a polar transmitter, comprising an amplitude path comprising an amplitude signal, which corresponds to the amplitude of a vector sum of an in-phase input signal (I) and a quadrature input signal (Q); a phase path comprising a phase modulator configured to phase-modulate a phase signal, which corresponds to the phase of the vector sum of input signals I and Q; a DPA configured to amplify the PM input signal based on the amplitude signal; a tunable matching network coupled to an output of the DPA and configured to adjust a load impedance of the DPA; and a controller configured to adjust the matching network based on retrieving a look-up table with respect to amplitude and frequency information derived from the PM signal and the amplitude signal, wherein the look-up table indicates a plurality of optimal operation modes of the matching network for specific combinations of amplitude and frequency information.

Such a polar transmitter can be applied as the key component in a wideband TX system. The polar transmitter provides superior saturated and back-off power efficiency with compact size.

In a first possible implementation form of the polar transmitter according to the first aspect, the amplitude information comprises an ACW of the amplitude path configured to drive inputs of the DPA, wherein the ACW is derived from the amplitude signal.

This provides the advantage that the polar transmitter implements a polar modulation scheme which mitigates the issue of linearity. The PM signal of PA can vary only in phase. Output power of the polar transmitter is determined by the ACW controlled switch-on number of the PA unit-cells. For analog polar transmitter, amplitude modulation is accomplished by directly controlling the gain of the power amplifier through changing or modulating its supply voltage. These polar modulation systems allow the use of highly non-linear power amplifier architectures such as Class D, Class E and Class F, etc.

In a second possible implementation form of the polar transmitter according to the first aspect as such or according to the first implementation form of the first aspect, the frequency information comprises a channel frequency of the PM signal in the phase path.

In a third possible implementation form of the polar transmitter according to the first aspect as such or according to any of the preceding implementation forms of the first aspect, the controller is configured to adjust the matching network based on feed-forward control in a DM signal path.

This provides the advantage that the feed-forward control-modes may be initially loaded to obtain the look-up table with the initial operation-modes. After a short initialization operation, the polar transmitter has initialized the lookup table with the initial operation modes and an initial matching network is available.

In a fourth possible implementation form of the polar transmitter according to the first aspect as such or according to any of the preceding implementation forms of the first aspect, the controller is configured to initiate the lookup-table during an initialization operation with a plurality of operation modes of the matching network, each operation mode related to a specific combination of an ACW and a channel frequency.

This provides the advantage that the polar transmitter can adjust an optimal matching network for a large variety of operation modes with respect to amplitude and frequency.

In a fifth possible implementation form of the polar transmitter according to the first aspect as such or according to any of the preceding implementation forms of the first aspect, the controller is configured to update the lookup-table during a training operation, based on a relation of training signals applied to the DPA and an output signal at an output of the matching network.

This provides the advantage that the polar transmitter can learn from different signal characteristics produced by the training signals that how to optimally adjust its matching network.

In a sixth possible implementation form of the polar transmitter according to the fifth implementation form of the first aspect, the controller is configured to update the lookup-table based on an optimization criterion with respect to at least one of a saturated power efficiency and a back-off power efficiency of the polar transmitter depending on the training signals and the output signal.

This provides the advantage that the polar transmitter provides superior saturated and back-off power efficiency.

In a seventh possible implementation form of the polar transmitter according to the first aspect as such or according to any of the preceding implementation forms of the first aspect, the matching network comprises a plurality of switched capacitors which are switchable by the controller.

This provides the advantage that the dynamic matching network can be adjusted by using capacitors and without using additional inductors which is advantageous for a CMOS implementation. Hence, the chip layout is very compact.

In an eighth possible implementation form of the polar transmitter according to the seventh implementation form of the first aspect, the plurality of switched capacitors are controlled by digital bits which are adjustable by the controller.

This provides the advantage that the controller can efficiently control the operation mode of the DM network.

In a ninth possible implementation form of the polar transmitter according to the seventh or the eighth implementation form of the first aspect, each operation mode of the matching network corresponds to a specific setting of the switched capacitors.

This provides the advantage that the controller can easily switch the different operation modes of the DM network resulting in a fast loading of the lookup table.

In a tenth possible implementation form of the polar transmitter according to any of the seventh to the ninth implementation forms of the first aspect, the matching network comprises a transformer, and a first subset of the plurality of switched capacitors is tapped and embedded on a secondary winding of the transformer acting as a loading of the transformer.

This provides the advantage that the controller can easily vary the characteristics of the secondary winding and the loading of the transformer by adjusting the first subset of switched capacitors.

In an eleventh possible implementation form of the polar transmitter according to the tenth implementation form of the first aspect, a second subset of the plurality of switched capacitors is located at primary winding ports of the transformer.

This provides the advantage that the controller can easily vary the matching capacitance at primary winding ports by adjusting the second subset of switched capacitors.

In a twelfth possible implementation form of the polar transmitter according to the eleventh implementation form of the first aspect, a third subset of the plurality of switched capacitors is located at secondary winding ports of the transformer.

This provides the advantage that the controller can easily vary the matching capacitance at secondary winding ports by adjusting the third subset of switched capacitors.

In a thirteenth possible implementation form of the polar transmitter according to any of the seventh to the twelfth implementation forms of the first aspect, the switched capacitors are in binary weight controlled by a binary code or in thermometer weight controlled by a thermometer code.

This provides the advantage that the controller can easily achieve a large dynamic range or accurate tuning of matching impedance in operation modes tunable by the switched capacitors.

According to a second aspect, the disclosure relates to a method for adjusting a matching network coupled to an output of a DPA of a polar transmitter, the method comprising initiating a lookup-table with a plurality of operation modes of the matching network, each operation mode related to a specific combination of amplitude and frequency information derived from an input signal of the DPA; and updating the lookup-table based on a relation of a training signal provided at a signal input of the DPA and an output signal at an output of the matching network.

Such a method can be advantageously applied for controlling a polar transmitter providing superior saturated and back-off power efficiency with compact size. The operation modes are trained to obtain the optimized matching modes under various ACWs and RF signal. Such method extends the operation bandwidth and improves the power efficiency of the TX with DM network compared to the TX without DM network.

In a first possible implementation form of the method according to the second aspect, the method further comprises updating the lookup-table based on an optimization criterion with respect to at least one of saturated power efficiency and back-off power efficiency of the polar transmitter depending on the training signal and the output signal.

This provides the advantage that the method can control a polar transmitter providing superior saturated and back-off power efficiency.

BRIEF DESCRIPTION OF THE FIGURES

Further embodiments of the disclosure will be described with respect to the following figures.

DETAILED DESCRIPTION

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
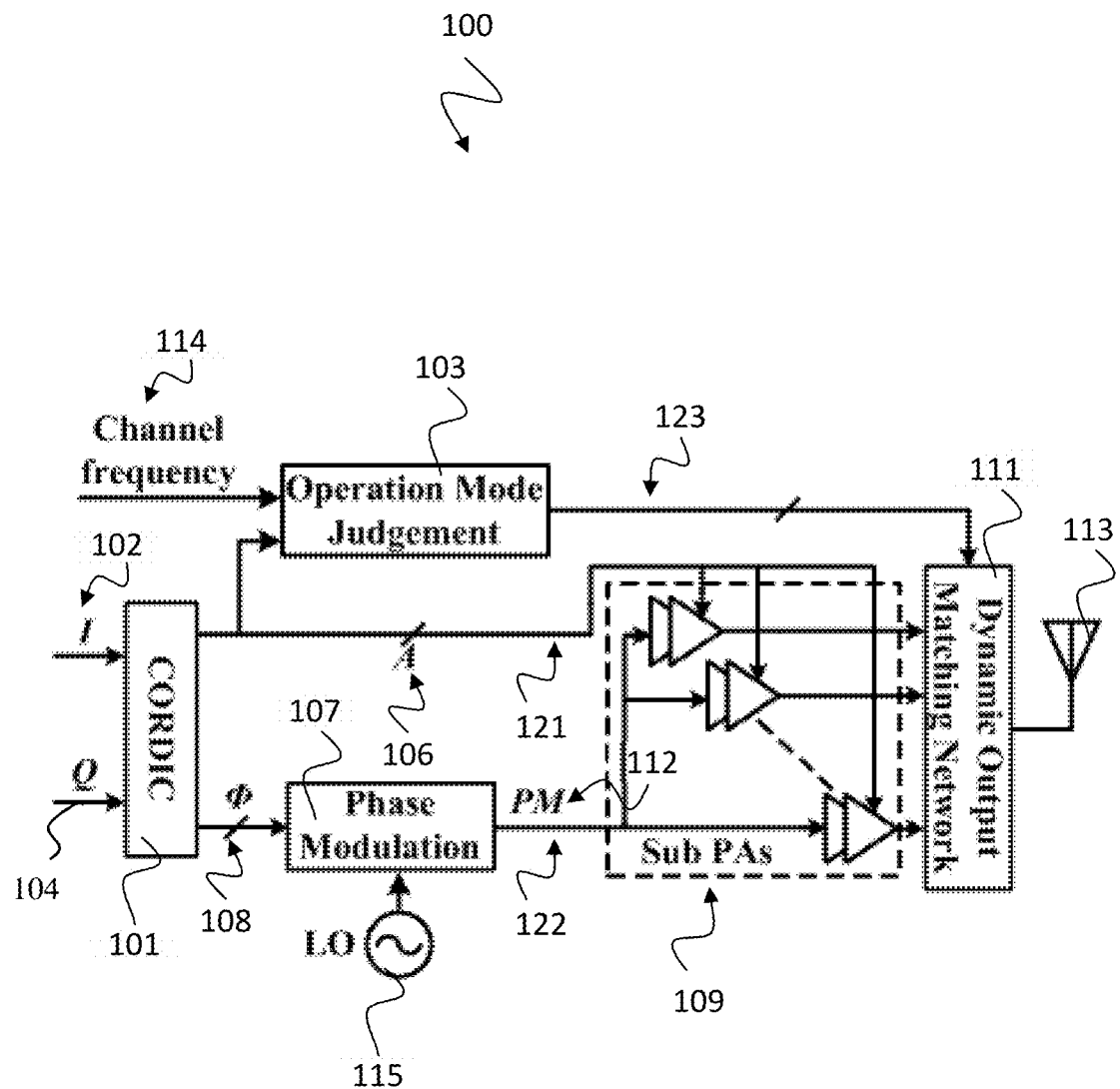
FIG. 1 shows a block diagram illustrating the architecture of a digital polar transmitter with feed-forward controlled multi-modes DM network 100 according to an implementation form.

FIG. 1 shows a block diagram illustrating the architecture of a digital polar transmitter with feed-forward controlled multi-modes dynamic matching network 100 according to an implementation form. The figure illustrates a wideband digital assisted polar TX having three signal paths embedded in the structure namely the amplitude signal path 121, the phase signal path 122, and an additional controlled DM signal path 123. The optimum impedance at back-off power level is larger than the optimum impedance at saturated power. Meanwhile, the optimum load impedances are different at different operation frequencies. For the matching network without DM, the fixed impedance is chosen which could degrade the PA's performance at some frequencies. Therefore using the DM network 111 allows to improve the PA's efficiency.

The polar transmitter 100 includes an amplitude path 121 with an amplitude input signal 106, which is the amplitude of the vector sum of an input signal I 102 and a input signal Q 104. The polar transmitter 100 includes a phase path 122 including a phase modulator 107 that phase-modulates a phase signal 108, which is the phase of the vector sum of input signal I 102 and input signal Q 104. The polar transmitter 100 includes a DPA 109 that amplifies the PM signal 112 based on the amplitude signal 106. The PM signal 112 corresponds to the phase signal 108 which is phase-modulated by the phase modulator 107. The polar transmitter 100 includes a tunable matching network 111 that is coupled to an output of the DPA 109 and that adjusts a load impedance of the DPA 109. The polar transmitter 100 further includes a controller 103 that adjusts the matching network 111 based on retrieving a look-up table with respect to amplitude and frequency information derived from the PM signal 112 and the amplitude signal 106. The look-up table indicates a plurality of optimal operation modes of the matching network 111 for specific combinations of amplitude and frequency information.

A LO 115 is used to provide a LO signal to the phase modulator 107.

The amplitude information may include an ACW of the amplitude path 121 to drive inputs of the DPA 109. The ACW is derived from the amplitude signal 106.

The frequency information may include a channel frequency 114 of the PM signal 112 in the phase path 122.

The controller 103 may adjust the matching network 111 based on feed-forward control in a DM signal path 123, e.g. as described below with respect to FIG. 2.

The controller 103 may initiate the lookup-table during an initialization operation with a plurality of operation modes of the matching network 111 wherein each operation mode is related to a specific combination of an ACW and a channel frequency 114.

The controller 103 may update the lookup-table during a training operation, based on a relation of training signals applied to the DPA 109 and an output signal at an output of the matching network 111.

The controller 103 may update the lookup-table based on an optimization criterion with respect to saturated power efficiency and/or back-off power efficiency of the polar transmitter 100 depending on the training signals and the output signal.

The matching network 111 may include a plurality of switched capacitors, e.g. as described below with respect to FIGS. 3A, 3B, 3C which are switchable by the controller 103. The plurality of switched capacitors may be controlled by digital bits which are adjustable by the controller 103. Each operation mode of the matching network 111 may correspond to a specific setting of the switched capacitors. The matching network 111 may include a transformer, e.g. as described below with respect to FIGS. 3A, 3B, 3C. A first subset of the plurality of switched capacitors may be tapped and embedded on a secondary winding of the transformer which acts as a loading of the transformer.

A second subset of the plurality of switched capacitors may be located at primary winding ports of the transformer. A third subset of the plurality of switched capacitors may be located at secondary winding ports of the transformer. The switched capacitors may be in binary weight controlled by a binary code or in thermometer weight controlled by a thermometer code, e.g. as described below with respect to FIGS. 3A, 3B, 3C.

The output of the DM network 111 may be provided to an antenna port 113.

Figure 2:
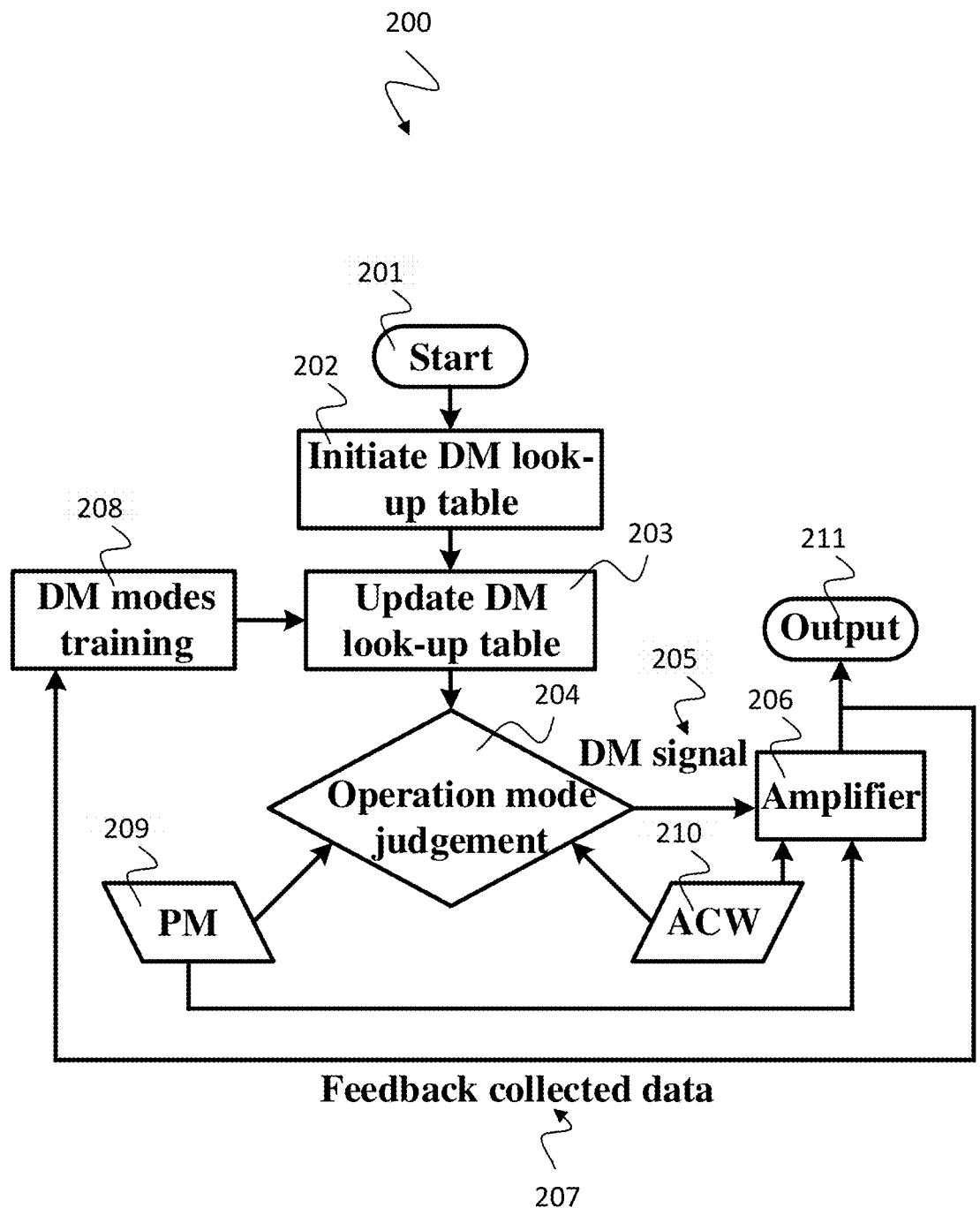
FIG. 2 shows an operation flow-chart 200 of the digital polar transmitter with DM network 100 according to an implementation form.

FIG. 2 shows an operation flow-chart 200 of the digital polar transmitter with DM network 100 according to an implementation form.

The operation flow-chart is shown in FIG. 2. The feed-forward control-modes are trained first to obtain the optimized look-up table of the operation-mode. Then, the DPA output is collected from various combinations of ACW, RF signal and matching-modes. Hence, the control signal of the optimized operation-mode for DM network can be chosen according to the look-up table, real-time ACW and RF signal.

The operation flow chart 200 includes the following blocks.

After start 201 the DM lookup table is initiated 202 and updated 203. The updating 203 depends on the DM training modes 208 that are received based on feeding back collected data 207 from the output 211 of the amplifier 206. The updated DM lookup table 203, the PM signal 209 and the ACW 210 are used to perform operation mode judgement 204 which results in a DM signal 205 that is provided together with the ACW 120 and the PM signal 209 to the amplifier 206.

Hence, the matching network is adjusted based on retrieving a look-up table with respect to amplitude and frequency information derived from the PM and amplitude signals. The look-up table indicates a plurality of optimal operation modes of the matching network for specific combinations of amplitude and frequency information.

Figure 3A:
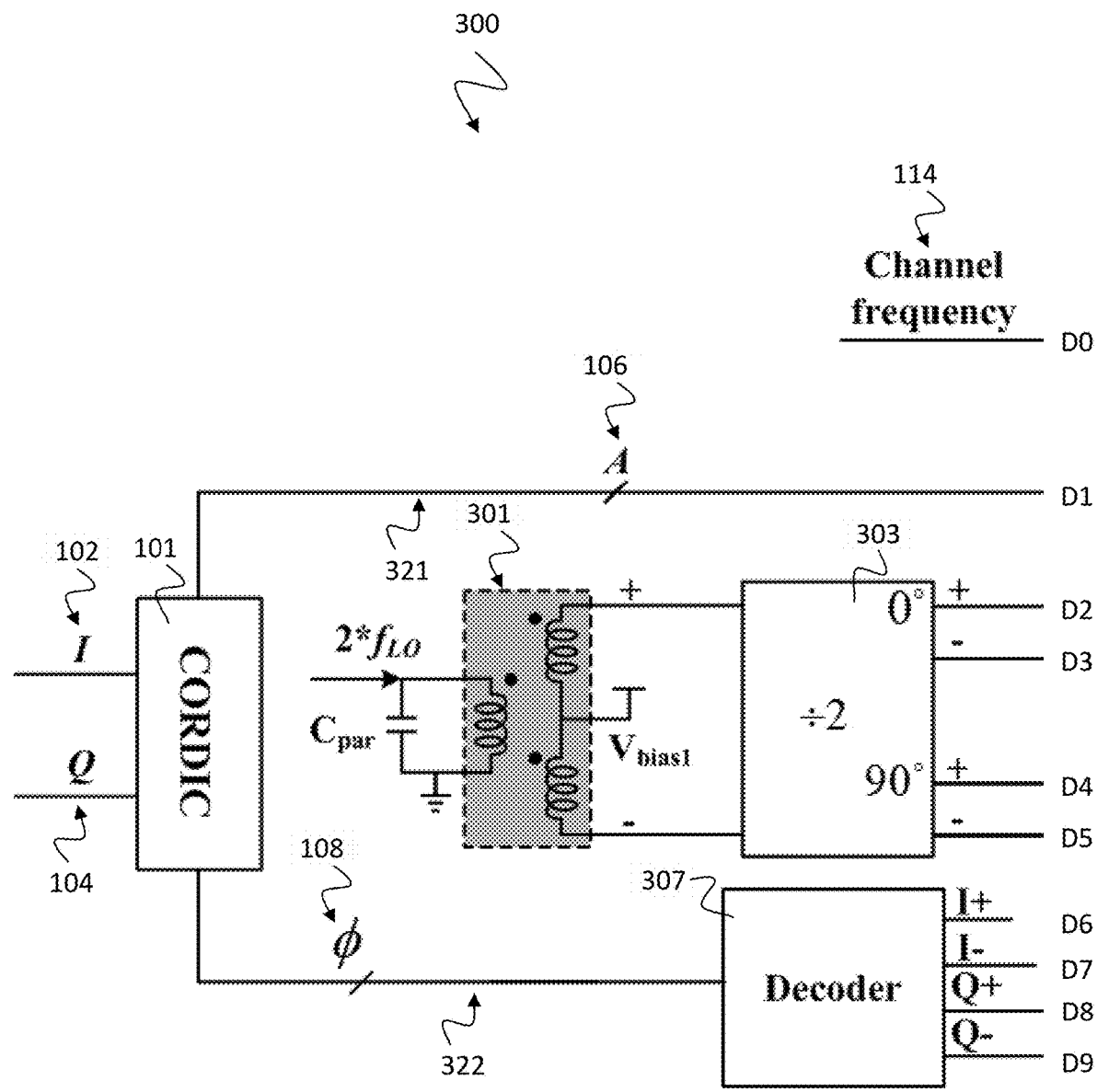
FIGS. 3A, 3B and 3C show a block diagram illustrating the system architecture of a digital polar transmitter 300A, 300B, 300C with DM network and integrated phase modulator according to an implementation form.
Figure 3B:
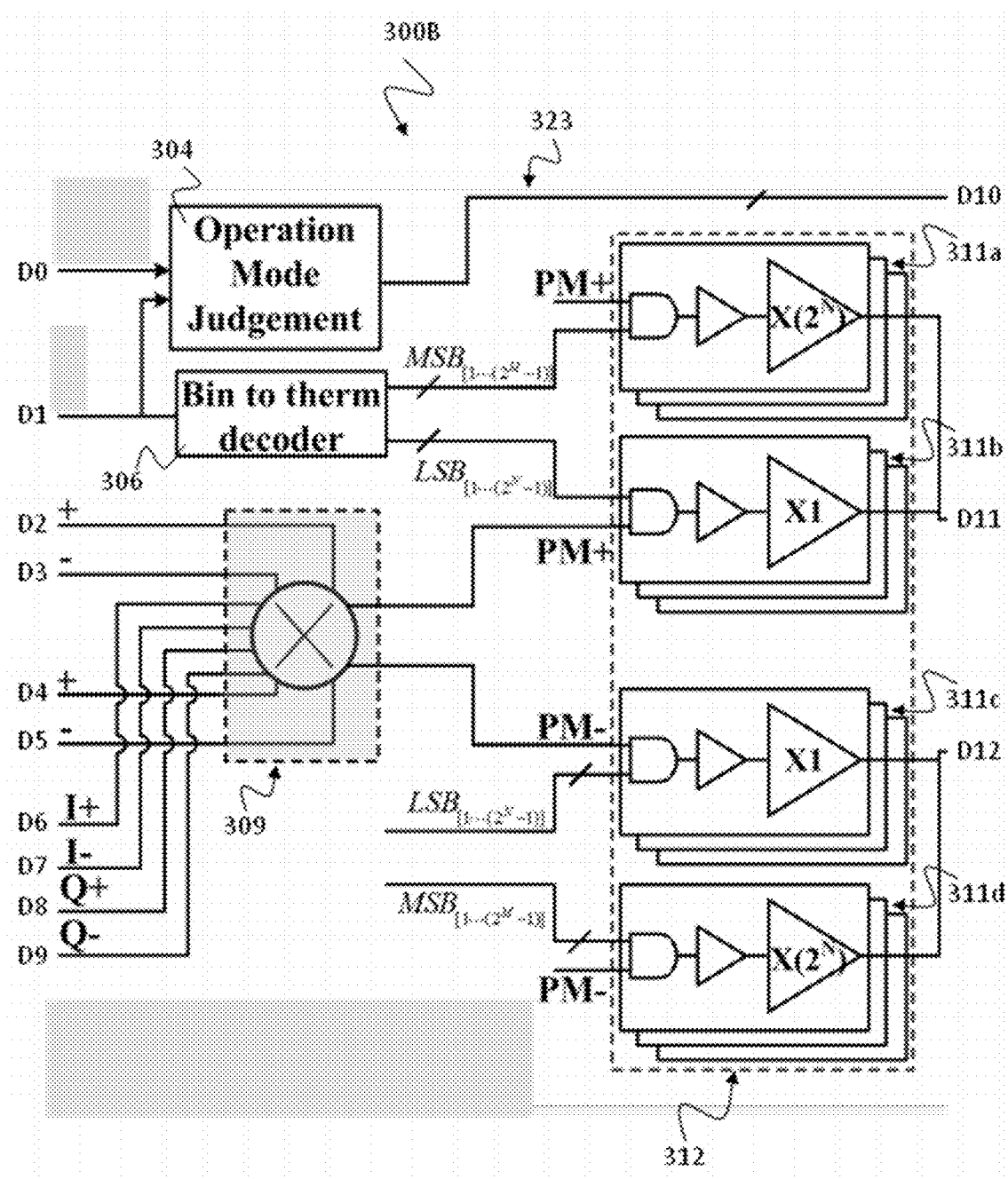
Figure 3C:
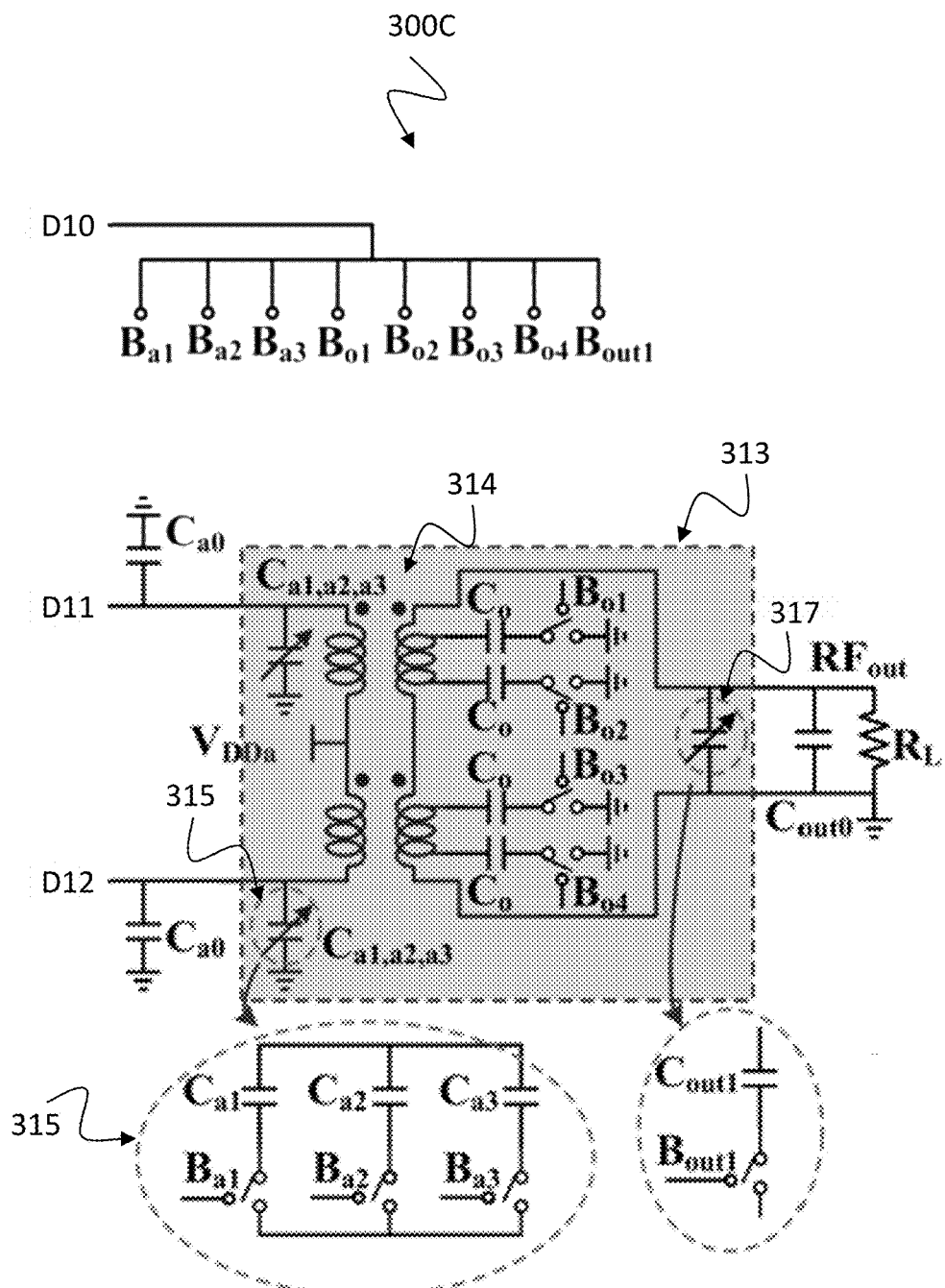

FIGS. 3A, 3B and 3C show a block diagram illustrating the system architecture of a digital polar transmitter 300A, 300B, 300C with DM network and integrated phase modulator according to an implementation form. For a better visibility the whole architecture is partitioned into 3 parts which are illustrated in FIGS. 3A, 3B and 3C. Data lines that are connected between the first part 300A and the second part 300B are D0, D1, D2, D3, D4, D5, D6, D7, D8 and D9. Data lines that are connected between the second part 300B and the third part 300C are D10, D11 and D12.

To improve the saturated and back-off efficiency of digital assisted polar TX, a novel architecture using multi-mode DM network 313 with feed-forward operation is introduced, as shown in FIGS. 3A, 3B and 3C. The disclosed digital polar TX 300A, 300B, 300C includes an input balun 301, a frequency divider 303, a digital phase modulator 309, a DPA 312 with feed-forward controlled multi-mode output matching network 313, operation mode judgement module 304, amplitude decoder 306, and PM decoder 307.

The digital polar modulator 300A, 300B, 300C includes a Coordinate Rotation Digital Computer (CORDIC) unit 101 to provide phase 108 and amplitude 106 of the input signal. The phase 108 is processed by a phase modulator 309. The amplitude signal 106 is passed to thermometer decoder 306 and the modulated phase signals PM+, PM− are passed to the DPA 312. A most significant bit (MSB) output of the thermometer decoder 306 is passed to two driver and power amplifier arrays 311a, 311d of the DPA 312. A least significant bit (LSB) output of the thermometer decoder 306 is passed to two driver and power amplifier arrays 311b, 311c of the DPA 312. The outputs of the DPA 312 are passed to the DM network 313.

Some of the input connections of the driver arrays 311a, 311b, 311c and 311d are simplified by the same net names (i.e. PM+, PM−, MSB, and LSB). All the PA array outputs are connected to the same dynamic matching network 313, as shown in FIGS. 3B and 3C.

The digital envelope signal input to the thermometer decoder 306 controls the DPA switching cells. The phase modulation signals PM+, PM− with RF carrier frequency are generated by the phase modulator 309. Digital AND gates combine the PM signal and the digital envelope signal to form a square wave vectors, that feed the DPA drivers 311a, 311b, 311c, 311d implemented as class-D amplifiers. The driver is composed of an inverter chain with optimized driving capability for different sizes of DPA unit cell. The drivers then feed the class-E PA output stages without any inter-stage matching.

The digital polar transmitter 300A, 300B, 300C with DM network and integrated phase modulator is a specific implementation form of the polar transmitter 100 depicted in FIG. 1.

The digital polar transmitter 300A, 300B, 300C includes an amplitude path 321 including the binary to thermometer decoder for amplitude component of the input signals I 102 and Q 104. The digital polar transmitter 300A, 300B, 300C includes a phase path 322 including a phase modulator 309 for phase-modulating the input signal 102, 104, frequency divider 303, and input balun 301. The input balun 301 with an input LO frequency of 2fLO produces differential signals 2fLO+, 2fLO− as the inputs of the frequency divider 303. The quadrature frequency divider 303 produces quadrature LO components D2, D3, D4, D5 with frequency of fLO. The phase modulator 309 receives the phase signal 108 decoded into a positive in-phase component I+, a negative in-phase component I−, a positive quadrature-phase component Q+ and a negative quadrature-phase component Q−. The phase modulator 309 further receives quadrature LO components D2, D3, D4, D5.

The digital polar transmitter 300A, 300B, 300C further includes a DPA 312 for amplifying the PM input signal PM+, PM− that is an output of the phase modulator 309 based on the ACW MSB[1 ... (2M−1)], LSB[1 ... (2N−1)], LSB[1 ... (2N−1)] and MSB[1 ... (2M−1)]. The ACW is converted from amplitude signal through the thermometer decoder 306.

The digital polar transmitter 300A, 300B, 300C further includes a tunable matching network 313 coupled to an output (D11, D12) of the DPA 312. The tunable matching network 313 adjusts or tunes the load impedance RL of the DPA 312.

The digital polar transmitter 300A, 300B, 300C further includes a controller 304 that is configured to adjust the matching network 313 based on retrieving a look-up table with respect to amplitude and frequency information derived from the PM signal PM+, PM− and the amplitude signal 106, e.g. as described above with respect to FIG. 2. The look-up table indicates a plurality of optimal operation modes of the matching network 313 for specific combinations of amplitude and frequency information.

The amplitude information includes an ACW of the amplitude path 321 that is configured to drive inputs of the DPA 312. The ACW is derived from the amplitude signal 106.

The frequency information includes a channel frequency 114 of the PM signal PM+, PM− in the phase path 322.

The controller 304 is configured to adjust the matching network 313 based on feed-forward control in a DM signal path 323. The controller 304 is configured to initiate the lookup-table during an initialization operation with a plurality of operation modes of the matching network 313, each operation mode related to a specific combination of an ACW and a channel frequency 114. The controller 304 is configured to update the lookup-table during a training operation, based on a relation of training signals applied to the DPA 312 and an output signal at an output of the matching network 313. The controller 304 is configured to update the lookup-table based on an optimization criterion with respect to at least one of saturated power efficiency and back-off power efficiency of the polar transmitter 300A, 300B, 300C depending on the training signals and the output signal.

The matching network 313 includes a plurality of switched capacitors Co1, Co2, Co3, Co4, Ca1, Ca2, Ca3, Cout1, which are switchable by the controller 304. The plurality of switched capacitors Co1, Co2, Co3, Co4, Ca1, Ca2, Ca3, Cout1, are controlled by digital bits Bo1, Bo2, Bo3, Bo4, Ba1, Ba2, Ba3, Bout1, which are assigned to a respective one of the plurality of switched capacitors Co1, Co2, Co3, Co4, Ca1, Ca2, Ca3, Cout1 and which are adjustable by the controller 304.

Each operation mode of the matching network 313 corresponds to a specific setting of the switched capacitors Co1, Co2, Co3, Co4, Ca1, Ca2, Ca3 and Cout1.

The matching network 313 includes a transformer 314. A first subset of the plurality of switched capacitors Co1, Co2, Co3, Co4 is tapped and embedded on a secondary winding of the transformer 314 which is acting as a loading of the transformer 314. A second subset of the plurality of switched capacitors Ca1, Ca2, Ca3 315 is located at primary winding ports of the transformer 314. A third subset of the plurality of switched capacitor Cout1 317 is located at secondary winding ports of the transformer 314. The switched capacitors Co1, Co2, Co3, Co4, Ca1, Ca2, Ca3 and Cout1 are in binary weight controlled by a binary code or in thermometer weight controlled by a thermometer code.

The disclosed DM network 313 can be reconfigured by the switched capacitors Co1, Co2, Co3, Co4, Ca1, Ca2, Ca3 and Cout1. Four switched loaded-capacitors (i.e., controlled by digital-bits Bo1, . . . , and Bo4) are tapped and embedded on the secondary winding of the transformer 314. Other switched parallel-capacitors are located at primary and secondary windings ports of the transformer 314 (i.e., controlled by digital-bits Ba1, Ba2, Ba3, and Bout1, respectively). By controlling the switched loaded-capacitors Co, the current distribution on the transformer 314 windings is varied, which affects the mutual inductance and coupling factor of the transformer 314. Therefore, comparing to the conventional loaded transformers, the equivalent inductance and capacitance of the disclosed transformer 314 can be both finely tuned. Meanwhile, the arrangement of parallel-capacitor arrays Ca and Cout have significant influence on the frequency response of the total matching network 313.

Figure 4:
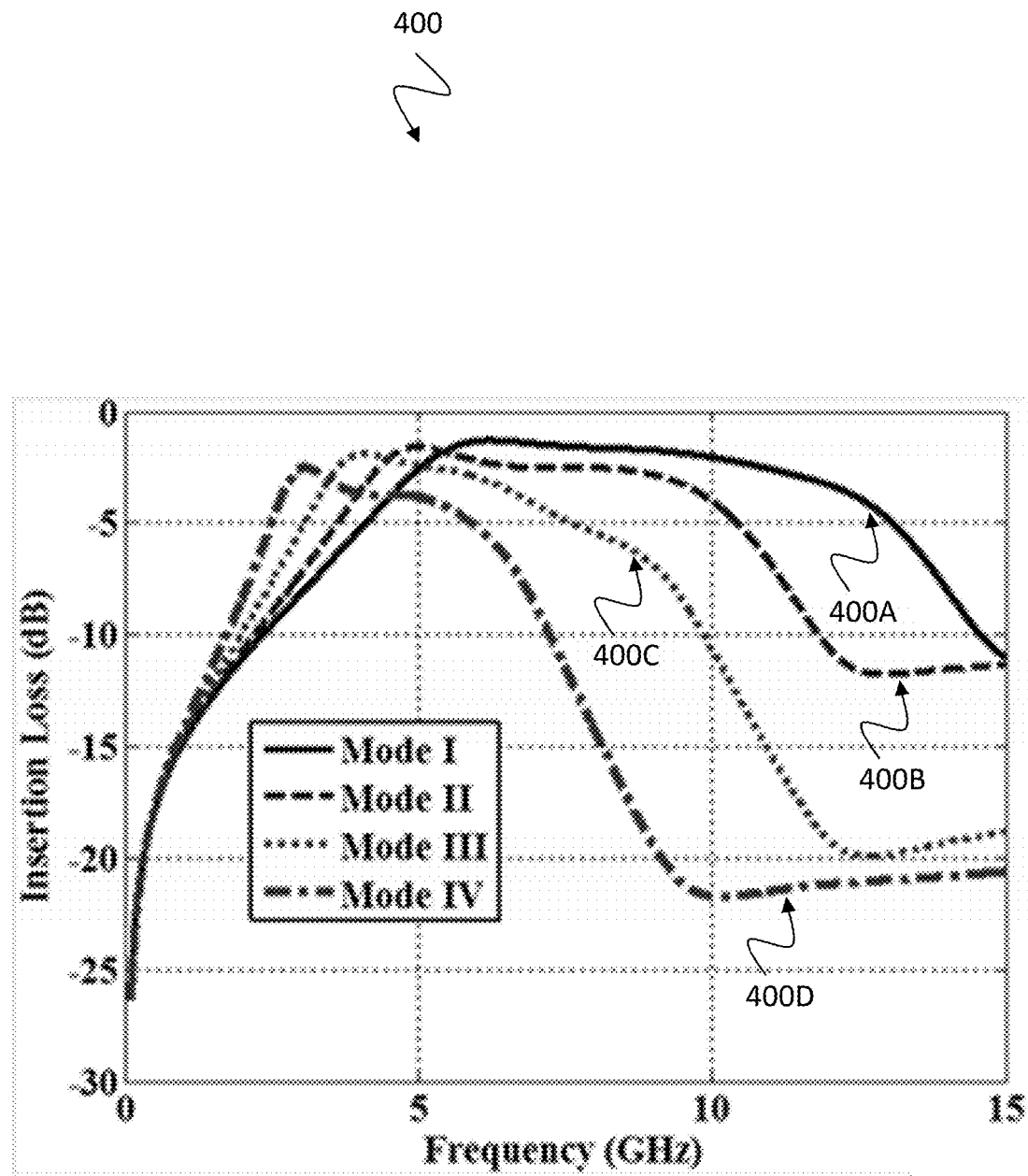
FIG. 4 shows a performance diagram 400 illustrating the insertion loss of the DM network depicted in FIG. 3C under various operation-modes.

FIG. 4 shows a performance diagram 400 illustrating the insertion loss of the DM network depicted in FIG. 3C under various operation-modes. The four graphs 400A (Mode I), 400B (Mode II), 400C (Mode III) and 400D (Mode IV) depict typically simulated insertion loss of the DM network 313 under cases of optimized frequency responses at 3, 4, 5, and 6-10 GHz, respectively.

Figure 5:
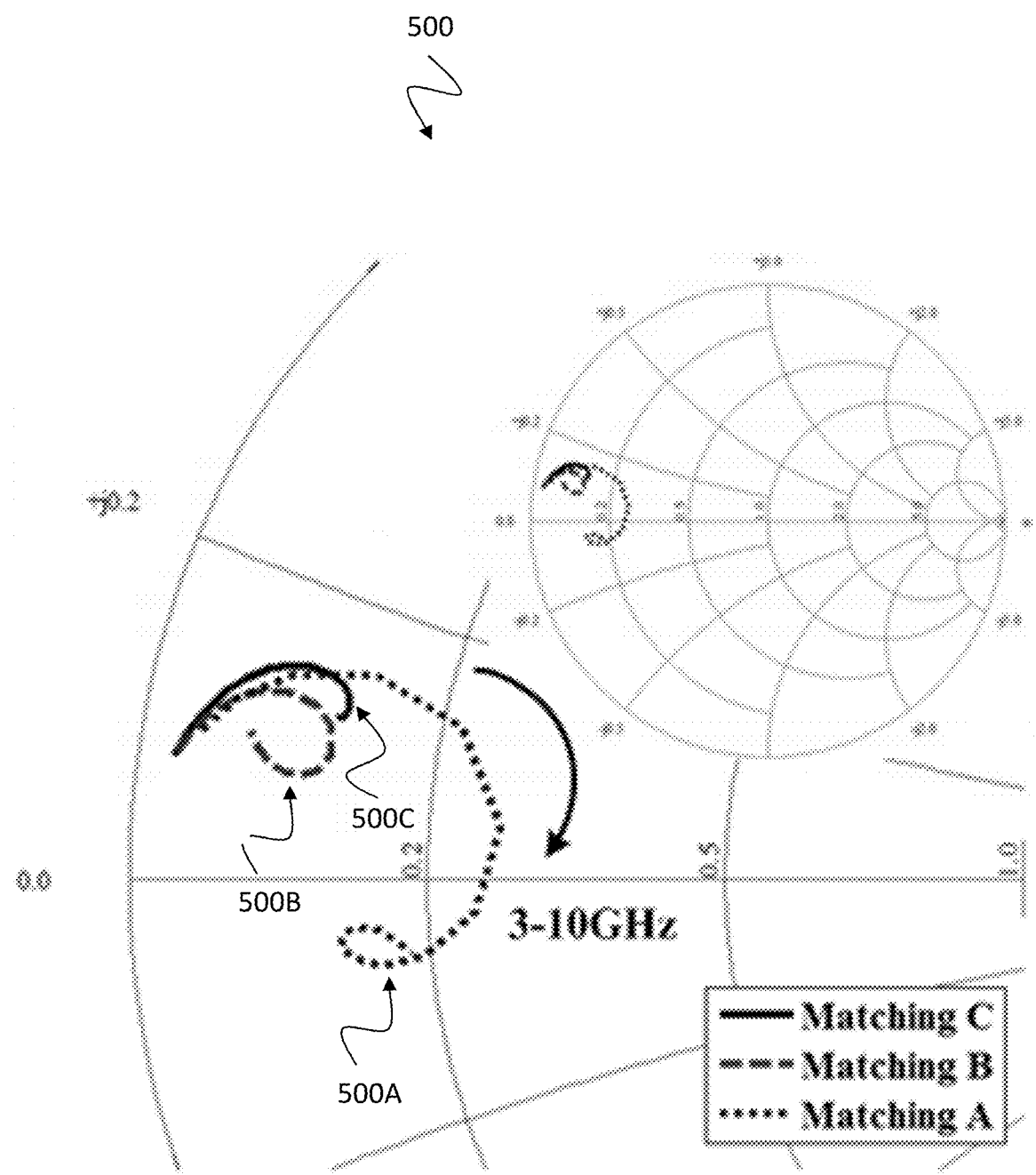
FIG. 5 shows a frequency diagram 500 illustrating the simulation results of the normalized input impedance for the DM network depicted in FIG. 3C from 3 to 10 gigahertz (GHz)

FIG. 5 shows a frequency diagram 500 illustrating the simulation results of the normalized input impedance for the DM network depicted in FIG. 3C from 3 to 10 GHz.

It is notable that the input impedance of the DM network 313 is tuned towards the optimum impedance by different matching configurations, for example a first matching configuration 500A (Matching A), a second matching configuration 500B (Matching B) and a third matching configuration 500C (Matching C) as shown in FIG. 5. Therefore, the DM network 313 can operate as the DPA's 312 dynamic load-impedance to improve the output power, saturated power efficiency and back-off efficiency.

Figure 6:
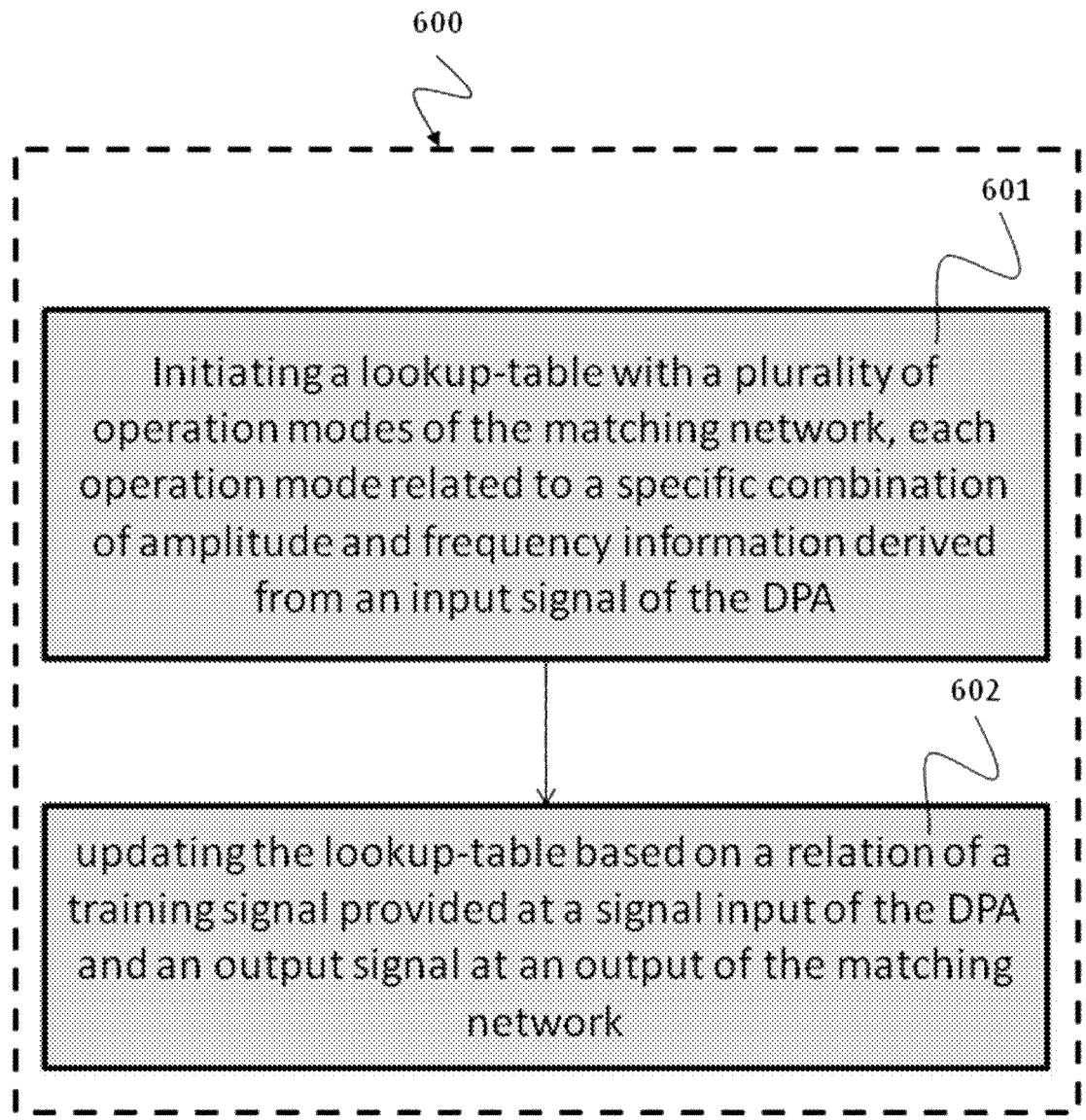
FIG. 6 shows a schematic diagram illustrating a method 600 for adjusting a matching network according to an implementation form.

FIG. 6 shows a schematic diagram illustrating a method 600 for adjusting a matching network according to an implementation form. The method 600 may be used for adjusting a matching network coupled to an output of a DPA of a polar transmitter, e.g. a polar transmitter 100 as described above with respect to FIG. 1 or a polar transmitter 300A, 300B, 300C as described above with respect to FIGS. 3A, 3B and 3C. The method 600 includes initiating 601 a lookup-table with a plurality of operation modes of the matching network, each operation mode related to a specific combination of amplitude and frequency information derived from an input signal of the DPA, e.g. as described above with respect to FIGS. 1 to 5. The method 600 further includes updating 602 the lookup-table based on a relation of a training signal provided at a signal input of the DPA and an output signal at an output of the matching network, e.g. as described above with respect to FIGS. 1 to 5.

The method 600 may further include updating 602 the lookup-table based on an optimization criterion with respect to at least one of a saturated power efficiency and a back-off power efficiency of the polar transmitter depending on the training signal and the output signal, e.g. as described above with respect to FIGS. 1 to 5.

The present disclosure also supports a digital signal process (DSP) program product including DSP platform executable code or DSP platform executable instructions that, when executed, causes at least one DSP platform to execute the performing and computing steps described herein, in particular the method 600 as described above with respect to FIG. 6 and the techniques described above with respect to FIGS. 1 to 5. Such a DSP program product may include a readable non-transitory storage medium storing program code thereon for use by a DSP platform, e. g. Field-Programmable Gate Array (FPGA), Complex Programmable Logic Device (CPLD), computer, etc. The program code may perform the method 600 as described above with respect to FIG. 6.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence. Many alternatives, modifications and variations will be apparent to those skilled in the art in light of the above teachings. Of course, those skilled in the art readily recognize that there are numerous applications of the disclosure beyond those described herein. While the present disclosure has been described with reference to one or more particular embodiments, those skilled in the art recognize that many changes may be made thereto without departing from the scope of the present disclosure. It is therefore to be understood that within the scope of the appended claims and their equivalents, the disclosure may be practiced otherwise than as specifically described herein.

What is claimed is:
1. A digital transmitter, comprising:
a first path configured to provide a first signal;
a second path coupled to the first path and configured to provide a second signal;

a digital power amplifier (DPA) coupled to the first path and the second path, wherein the DPA is configured to amplify the first signal based on the second signal, wherein the DPA comprises multiple power amplifier (PA) arrays, and wherein an input connection of each of the PA arrays is coupled to the first path; and a tunable matching network coupled to an output of each of the PA arrays, wherein the tunable matching network comprises:

a transformer;

a plurality of capacitors directly coupled to the transformer; and a corresponding switch directly coupled to each of the capacitors, wherein each of the capacitors is controllable by a digital bit applied to the corresponding capacitor.

2. The digital transmitter of claim 1, wherein a first subset of the capacitors is integrated on a first winding of the transformer.

3. The digital transmitter of claim 2, wherein a second subset of the capacitors is located at primary winding ports of the transformer.

4. The digital transmitter of claim 3, wherein a third subset of the capacitors is located at secondary winding ports of the transformer.

5. The digital transmitter of claim 1, wherein a supply voltage to the DPA is adjusted based on the second signal.

6. The digital transmitter of claim 1, wherein the PA arrays comprise switching cells, and wherein switching on a number of the switching cells is controlled based on the second signal.

7. The digital transmitter of claim 6, wherein the DPA comprises the switching cells, and wherein switching on a number of the switching cells is controlled by a digital code of the second signal.

8. The digital transmitter of claim 1, wherein the DPA comprises switching cells, wherein each of the switching cells of the DPA comprises an AND gate and a driver, and wherein the AND gate is configured to use the first signal to feed the driver.

9. The digital transmitter of claim 8, wherein the driver is configured as an inverter chain.

10. The digital transmitter of claim 9, wherein the inverter chain has different driving capability for different sizes of each of the switching cells.

11. The digital transmitter of claim 10, wherein each of the switching cells further comprises a power amplifier (PA) coupled to the driver, wherein the PA is a non-linear PA.

12. The digital transmitter of claim 11, wherein the non-linear PA is one of a Class D amplifier, a Class E amplifier or a Class F amplifier.

13. The digital transmitter of claim 1, wherein the first signal corresponds to a phase of a vector sum of an in-phase input signal and a quadrature-phase input signal, and wherein the second signal corresponds to an amplitude of the vector sum of the in-phase input signal and the quadrature-phase input signal.

14. The digital transmitter of claim 1, further comprising a quadrature frequency divider, wherein the quadrature frequency divider is configured to produce quadrature local oscillator (LO) components with a frequency ($f_{LO}$), and wherein the first path is further configured to receive the quadrature LO components to modulate the first signal.

15. The digital transmitter of claim 14, wherein the digital transmitter further comprising an input balun coupled to the quadrature frequency divider.

16. A digital transmitter, comprising:

a digital power amplifier (DPA);

a tunable matching network coupled to the DPA and configured to adjust a load impedance of the DPA, wherein the tunable matching network comprises:

a transformer; a plurality of capacitors directly coupled to the transformer; and a corresponding switch directly coupled to each of the capacitors, wherein each of the capacitors is controllable by a digital bit applied to the corresponding capacitor.

17. The digital transmitter of claim 16, wherein a first subset of the capacitors is integrated on a first winding of the transformer.

18. The digital transmitter of claim 16, wherein a second subset of the capacitors is located at primary winding ports of the transformer.

19. The digital transmitter of claim 16, wherein a third subset of the capacitors is located at secondary winding ports of the transformer.

* * * * *

UNITED STATES PATENT AND TRADEMARK OFFICE
CERTIFICATE OF CORRECTION

PATENT NO. : 10,547,488 B2
APPLICATION NO. : 16/295630
DATED : January 28, 2020
INVENTOR(S) : Xun Luo and Jian Liang Page 1 of 1

It is certified that error appears in the above-identified patent and that said Letters Patent is hereby corrected as shown below:

On the Title Page

Item [30], delete "5200144" and insert --15200144.2--

Signed and Sealed this
Tenth Day of March, 2020

Andrei Iancu
*Director of the United States Patent and Trademark Office*